(12) United States Patent
Hayahi

(10) Patent No.: US 10,476,056 B2
(45) Date of Patent: Nov. 12, 2019

(54) BATTERY PACK HOUSING STRUCTURE, AND ELECTRONIC APPARATUS

(71) Applicant: NEC Platforms, Ltd., Kawasaki-shi, Kanagawa (JP)

(72) Inventor: Manabu Hayahi, Kanagawa (JP)

(73) Assignee: NEC Platforms, Ltd., Kawasaki-shi, Kanagawa (JP)

( * ) Notice: Subject to any disclaimer, the term of this patent is extended or adjusted under 35 U.S.C. 154(b) by 0 days.

(21) Appl. No.: 15/777,974

(22) PCT Filed: Aug. 26, 2016

(86) PCT No.: PCT/JP2016/003890
§ 371 (c)(1),
(2) Date: May 22, 2018

(87) PCT Pub. No.: WO2017/094206
PCT Pub. Date: Jun. 8, 2017

(65) Prior Publication Data
US 2018/0351141 A1    Dec. 6, 2018

(30) Foreign Application Priority Data
Dec. 1, 2015 (JP) .................. 2015-234471

(51) Int. Cl.
*H01M 2/10* (2006.01)
*H04M 1/02* (2006.01)
(Continued)

(52) U.S. Cl.
CPC ........ *H01M 2/1066* (2013.01); *G06F 1/1635* (2013.01); *G06F 1/1656* (2013.01);
(Continued)

(58) Field of Classification Search
CPC ............. H01M 2/1066; H01M 1/1656; H01M 1/1635; H01M 1/0262; H01M 5/0247;
(Continued)

(56) References Cited

U.S. PATENT DOCUMENTS

| 6,515,450 B1 | 2/2003 | Kaiho et al. |
| 2006/0079298 A1 | 4/2006 | Saitoh et al. |

(Continued)

FOREIGN PATENT DOCUMENTS

| JP | 2001-285431 A | 10/2001 |
| JP | 2015-015579 A | 1/2015 |

(Continued)

OTHER PUBLICATIONS

Written Opinion of the International Searching Authority of PCT/JP2016/003890 dated Oct. 25, 2016.
(Continued)

*Primary Examiner* — Gary D Harris
(74) *Attorney, Agent, or Firm* — Sughrue Mion, PLLC

(57) ABSTRACT

A battery pack housing structure is used for an electronic apparatus including a housing portion for housing a battery pack and a battery cover for covering the housing portion. The battery pack, the housing portion, and the battery cover comprise battery-pack side-surface protruding portions, housing-portion side-surface protruding portions, and cover lower-surface protruding portions, respectively. Before the battery pack is positioned at a mounting position in the electronic apparatus, the battery pack is positioned at a pre-mounting position. When the battery cover is mounted, the battery pack is pushed from the pre-mounting position to the mounting position. The battery-pack side-surface protruding portions, the housing-portion side-surface protruding portions, and the cover lower-surface protruding portions are engaged, and movement of the battery pack in a
(Continued)

terminal connection direction and movement of the battery pack from the lower surface toward the upper surface are thereby restricted.

5 Claims, 19 Drawing Sheets

(51) Int. Cl.
  *H05K 5/00* (2006.01)
  *H05K 5/02* (2006.01)
  *G06F 1/16* (2006.01)
(52) U.S. Cl.
  CPC ........ *H04M 1/0262* (2013.01); *H05K 5/0086* (2013.01); *H05K 5/0217* (2013.01); *H05K 5/0247* (2013.01); *H01M 2220/30* (2013.01); *H04M 1/0252* (2013.01); *H05K 5/0017* (2013.01)
(58) Field of Classification Search
  CPC ............. H01M 5/0217; H01M 5/0086; H01M 1/0252; H01M 5/0017; H01M 2220/30
  USPC .......................................................... 429/96
  See application file for complete search history.

(56) References Cited

U.S. PATENT DOCUMENTS

2009/0233655 A1    9/2009  Shi et al.
2013/0209866 A1*   8/2013  Watanabe ........... H01M 2/1066
                                                        429/163

FOREIGN PATENT DOCUMENTS

WO    2004/034488 A1    4/2004
WO    2012/057238 A1    5/2012

OTHER PUBLICATIONS

International Search Report of PCT/JP2016/003890 dated Oct. 25, 2016.

* cited by examiner

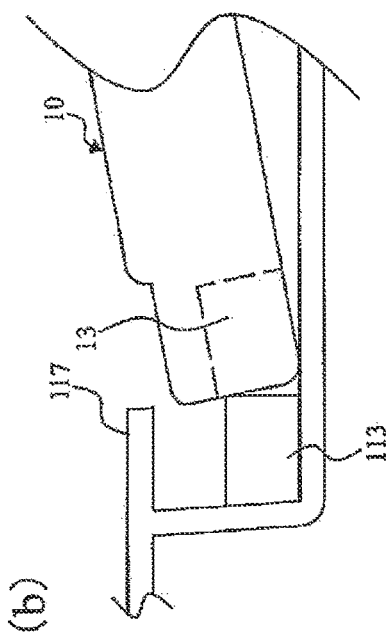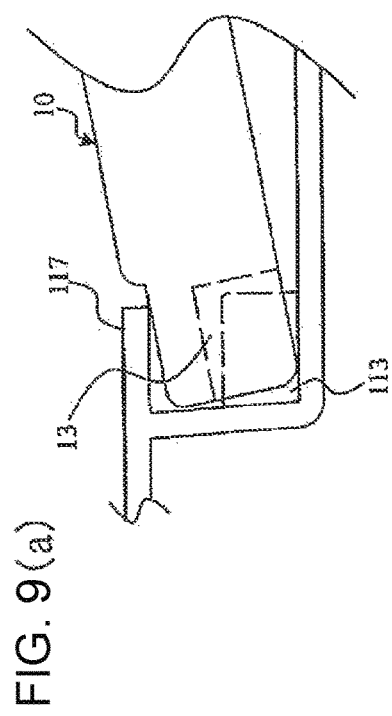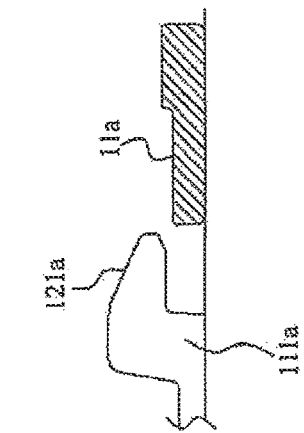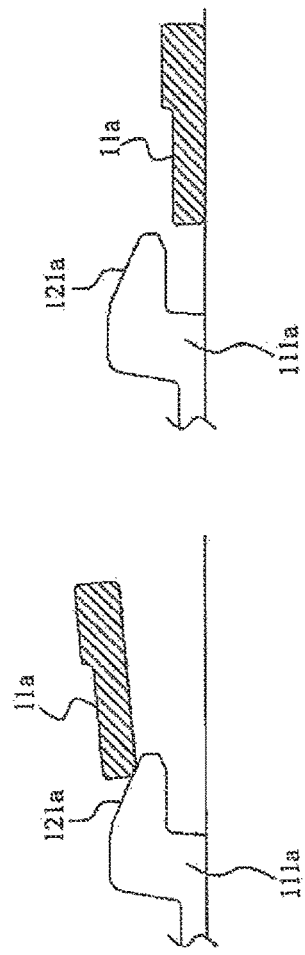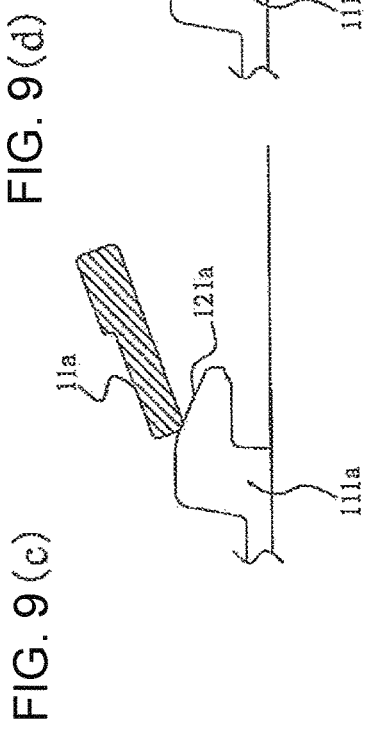

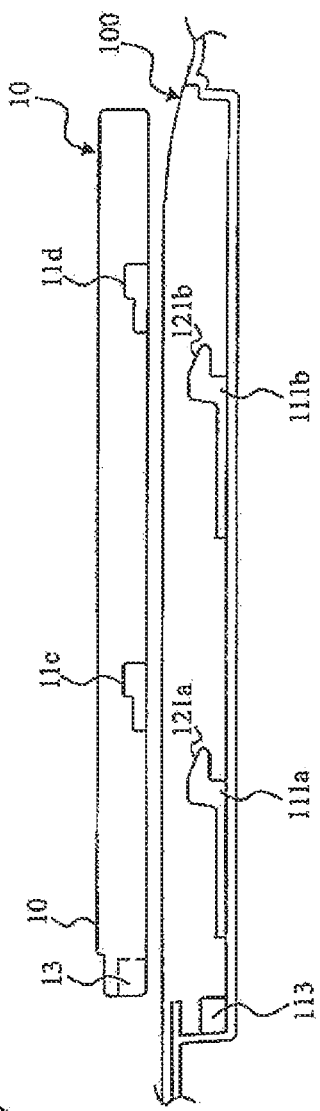
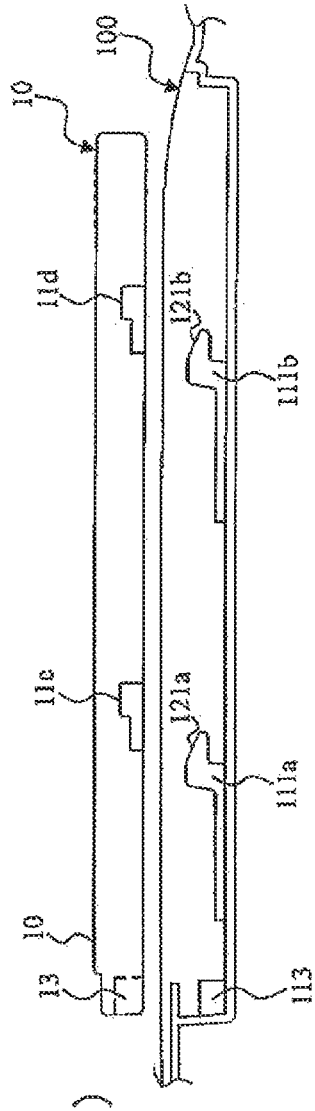
FIG. 15(a)
FIG. 15(b)

BATTERY PACK HOUSING STRUCTURE, AND ELECTRONIC APPARATUS

CROSS REFERENCE TO RELATED APPLICATIONS

This application is a National Stage of International Application No. PCT/JP 2016/003890 filed Aug. 26, 2016, claiming priority based on Japanese Patent Application No. 2015-234471 filed Dec. 1, 2015, the entire disclosure of which is incorporated herein by reference.

TECHNICAL FIELD

This invention relates to a battery pack housing structure and an electronic apparatus.

BACKGROUND ART

There exists an electronic apparatus which houses a battery pack in its housing portion in order to secure electric power needed for an operation.

In Patent Document 1, there is disclosed an internal battery holding structure for a portable device. In the disclosed internal battery holding structure, a battery hook is slid from a releasing position to a locking position to press a third locking protrusion of an internal battery. With such an action, a battery terminal is brought into abutment against a connector of a battery housing portion, and the internal battery is fixed to the battery housing portion.

PRIOR ART DOCUMENT(S)

Patent Document(s)

Patent Document 1: JP 2001-285431 A

SUMMARY OF THE INVENTION

Problem to be Solved by the Invention

However, with the internal battery holding structure disclosed in Patent Document 1, it is required that a user supports the internal battery by hand or the like to the end to position the internal battery in the battery housing portion at a position of sliding the battery hook from the releasing position to the locking position to press the third locking protrusion of the internal battery, that is, at a pre-mounting position being a position before the internal battery is brought to a mounting position.

An object of this invention is to provide a battery pack housing structure capable of allowing a battery pack to be positioned at a pre-mounting position without requiring the battery pack to be supported by hand or the like to the end when the battery pack is to be housed, and an electronic apparatus.

Means to Solve the Problem

According to this invention, there is provided a battery pack housing structure, which is used for an electronic apparatus including a housing portion for housing a battery pack, comprising a battery cover configured to cover the housing portion which houses the battery pack, wherein the battery pack has a substantially rectangular flat-plate shape, and includes a connection terminal provided to a first side surface and battery-pack side-surface protruding portions provided to a second side surface and a third side surface adjacent to the first side surface, wherein the housing portion includes: a bottom surface corresponding to a lower surface of the battery pack; a housing-portion connection terminal provided to a first housing-portion side surface being a side surface corresponding to the first side surface; and housing-portion side-surface protruding portions which are engageable with the battery-pack side-surface protruding portions and which are provided to a second housing-portion side surface being a side surface corresponding to the second side surface and a third housing-portion side surface being a side surface corresponding to the third side surface, respectively, wherein the battery cover includes cover lower-surface protruding portions provided to a lower surface of an edge portion corresponding to the second housing-portion side surface and a lower surface of an edge portion corresponding to the third housing-portion side surface, respectively, wherein the housing-portion side-surface protruding portions have inclination portions against which the battery-pack side-surface protruding portions are brought into abutment, wherein, before the battery pack is positioned at a mounting position in the electronic apparatus, when the battery-pack side-surface protruding portions of the second side surface and the third side surface are brought into abutment against the inclination portions, the battery pack slips off along the inclination portions so that the battery pack is positioned at a pre-mounting position at which the connection terminal of the battery pack and the housing-portion connection terminal are connectable to each other, and wherein, after the battery pack is positioned at the pre-mounting position, when the battery cover is mounted, the battery-pack side-surface protruding portions, the housing-portion side-surface protruding portions, and the cover lower-surface protruding portions are engaged, and movement of the battery pack in a terminal connection direction and movement of the battery pack from the lower surface toward the upper surface are thereby restricted.

Effect of the Invention

According to this invention, there can be provided a battery pack housing structure capable of allowing a battery pack to be positioned at a pre-mounting position without requiring the battery pack to be supported by hand or the like to the end when the battery pack is to be housed, and an electronic apparatus.

BRIEF DESCRIPTION OF THE DRAWING

FIGS. 9(a)-9(e) include 9(a) which is a view for illustrating an example of a positional relationship between a battery-pack connection terminal and a housing-portion connection terminal when the battery pack is to be housed in the housing portion, 9(b) which is a view for illustrating an example, which is different from the example of 9(a), of a positional relationship between the battery-pack connection terminal and the housing-portion connection terminal when the battery pack is to be housed in the housing portion, 9(c) which is a view for illustrating a positional relationship between a battery-pack side-surface protruding portion and the inclination portion when the battery pack is to be housed in the housing portion, 9(d) which is a view for illustrating a positional relationship between the battery-pack side-surface protruding portion and the inclination portion when the battery pack is to be housed in the housing portion and 9(e) which is a view for illustrating a positional relationship between the battery-pack side-surface protruding portion and the inclination portion when the battery pack is to be housed in the housing portion.

FIGS. 15(a) and 15(b) include views for illustrating a positional relationship between the battery-pack side-surface protruding portions and the housing-portion side-surface protruding portions.

MODE(S) FOR EMBODYING THE INVENTION

Now, embodiments of this invention are described in detail with reference to the drawings. Note that, similar descriptions are omitted as appropriate in order to avoid complications due to repetitive description.

[1. First Embodiment]

With reference to FIG. 1(a) to FIG. 5, description is made of structures of a battery pack 10, a housing portion 110 of an electronic apparatus 100, and a battery cover 200 in a first embodiment of this invention.

Figure 1A:
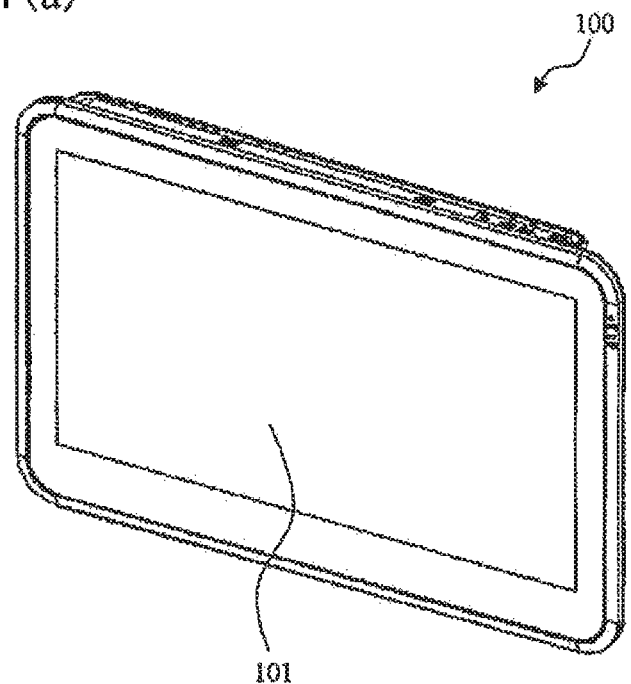
FIGS. 1(a) and 1(b) include 1(a) which is a perspective view for illustrating an example of an electronic apparatus including a battery pack housing structure according to this invention as seen from its front surface side and 1(b) which is a perspective view for illustrating an example of the electronic apparatus with illustration of the battery pack housing structure according to an embodiment of this invention as seen from its back surface side.
Figure 1B:
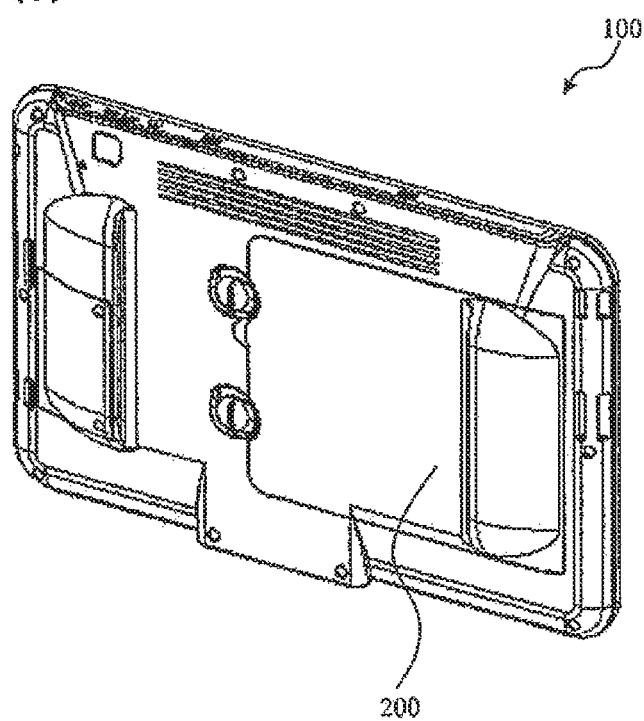
Figure 2:
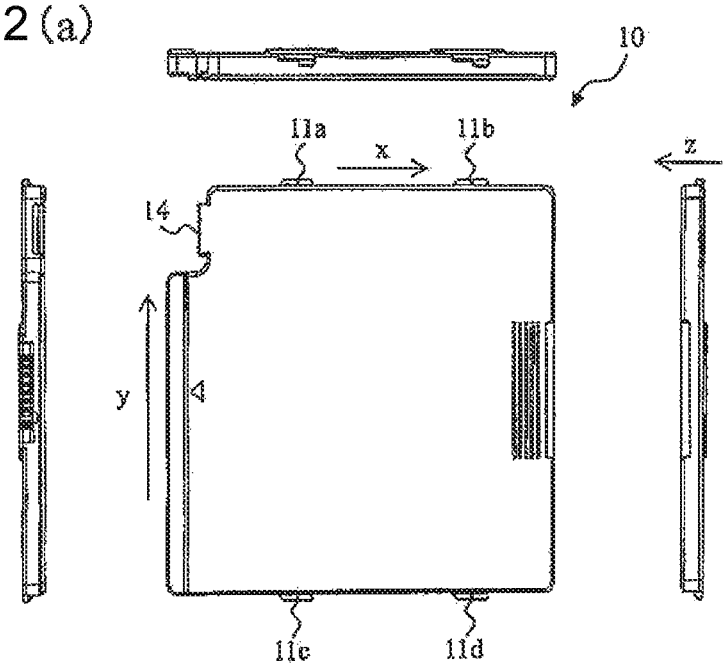
FIGS. 2(a) and 2(b) include 2(a) which is a view for illustrating structures of an upper surface and three side surfaces of a battery pack related to a first embodiment of this invention and 2(b) which is a view for illustrating a structure of a lower surface of the battery pack related to the first embodiment.
Figure 2:
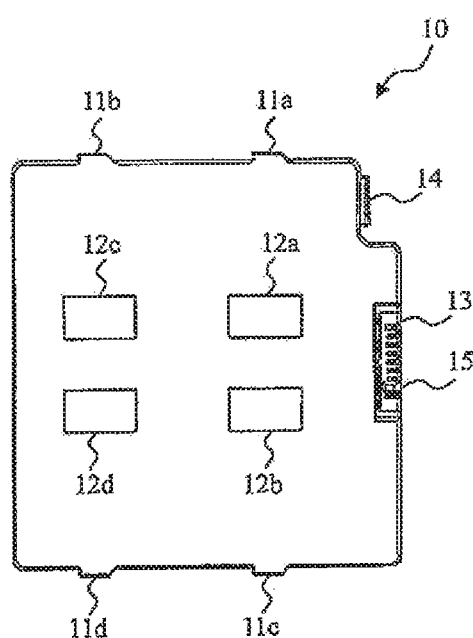

FIG. 1(a) and FIG. 1(b) are views for illustrating an example of the electronic apparatus 100 including a battery pack housing structure according to this invention. FIG. 1(a) is a perspective view for illustrating the electronic apparatus 100 as seen from its front surface side. FIG. 1(b) is a perspective view for illustrating the electronic apparatus 100 as seen from its back surface side.

As illustrated in FIG. 1(a), the electronic apparatus 100 is, for example, an electronic apparatus including a display 101 with a touch panel. As illustrated in FIG. 1(b), the electronic apparatus 100 includes, on its back surface side, a housing portion for housing a battery pack. The housing portion is covered with a battery cover 200. The battery pack housing structure according to this invention is applicable not only to the above-mentioned electronic apparatus 100 including the display 101 with a touch panel but also to various types of electronic apparatuses.

FIG. 2(a) is a plan view of the battery pack 10 as seen from its upper surface side and views as seen from its side surface sides from three directions. FIG. 2(b) is a view of the battery pack 10 as seen from its lower surface side. In FIG. 2(a), a horizontal direction, a vertical direction, and a thick direction of the battery pack 10 are hereinafter defined as an x direction, a y direction, and a z direction, respectively. In other words, in the battery pack 10, a direction perpendicular to a side surface, on which a plurality of battery-pack connection terminals 13 for electrical connection are provided, is defined as the x direction. A direction orthogonal to the x direction is defined as the y direction. A direction orthogonal to the x direction and the y direction is defined as the z direction. Further, directions indicated by the arrows of FIG. 2(a) are defined as + (plus) directions, and directions opposite to the arrows are defined as − (minus) directions. Thus, a +x (plus x) direction is a direction away from the side surface having the battery-pack connection terminals 13. A +z (plus z) direction is a direction from a lower surface toward an upper surface of the battery pack 10.

(1-1. Structure of Battery Pack)

With reference to FIG. 2(a) and FIG. 2(b), the battery pack 10 has a substantially rectangular flat-plate shape, with protrusions and recessions in partial portions thereof. The battery pack 10 includes four battery-pack side-surface protruding portions 11a to 11d, four battery-pack lower-surface protruding portions 12a to 12d, the plurality of battery-pack connection terminals 13, a battery-pack claw portion 14, and a battery-pack terminal positioning portion 15. The battery-pack connection terminals 13 are achieved with receiving portions capable of receiving housing-portion connection terminals 113 provided in the housing portion 110, which are described later.

The battery-pack side-surface protruding portion 11a and the battery-pack side-surface protruding portion 11b are provided on one side surface of two side surfaces along the x direction, and are protruding portions each having an L-shape protruding in a +y (plus y) direction.

The battery-pack side-surface protruding portion 11c and the battery-pack side-surface protruding portion 11d are provided on another side surface of the two side surfaces along the x direction, and are protruding portions each having an L-shape protruding in a −y (minus y) direction. The battery-pack side-surface protruding portion 11c is provided to a position opposite to the battery-pack side-surface protruding portion 11a, so that positions thereof in the x direction are the same. The battery-pack side-surface protruding portion 11d is provided to a position opposite to the battery-pack side-surface protruding portion 11b, so that positions thereof in the x direction are the same.

The battery-pack lower-surface protruding portion 12a to 12d are provided on the lower surface of the battery pack 10 so as to protrude in a −z (minus z) direction, and are protruding portions each having a quadrangular cross section in the vertical direction (transverse direction). A protruding portion having a quadrangular cross section, for example, may be a rectangular parallelepiped having long sides along the x direction and short sides along the y direction. Moreover, the battery-pack lower-surface protruding portion 12a and the battery-pack lower-surface protruding portion 12b are arrayed in the y direction so that respective longitudinal directions are parallel to the x direction. Similarly, the battery-pack lower-surface protruding portion 12c and the battery-pack lower-surface protruding portion 12d are arrayed in the y direction so that respective longitudinal directions are parallel to the x direction. Further, the battery-pack lower-surface protruding portion 12a and the battery-pack lower-surface protruding portion 12c are arrayed in the x direction so that respective transverse directions are parallel to the y direction and that positions thereof in the y direction are the same. Similarly, the battery-pack lower-surface protruding portion 12b and the battery-pack lower-surface protruding portion 12d are arrayed in the x direction so that respective transverse directions are parallel to the y direction and that positions thereof in the y direction are the same. The number and the shape of the battery-pack lower-surface protruding portions are not particularly limited. For example, the battery-pack lower-surface protruding portions may be protruding portions each having a triangular or semicircular cross section in the vertical direction.

The number and the shape of the protruding portions provided on the side surfaces of the battery pack 10 are not particularly limited to the above-mentioned example. The battery-pack lower-surface protruding portion 12a and the battery-pack lower-surface protruding portion 12c may be continuous with each other, and the battery-pack lower-surface protruding portion 12b and the battery-pack lower-surface protruding portion 12d may be continuous with each other. Moreover, a single row of battery-pack lower-surface protruding portions may be provided rather than two rows of battery-pack lower-surface protruding portions.

Each of the battery-pack connection terminals 13 is a terminal (socket) provided in the receiving portion formed on one side surface of two side surfaces along the y direction. The battery pack 10 is configured to supply electric power to the electronic apparatus 100 via the plurality of battery-pack connection terminals 13.

The battery-pack claw portion 14 is provided to a position close to a corner of the same side surface as the side surface on which the battery-pack connection terminals 13 are provided. A user can take out the battery pack 10 from the housing portion 110 of the electronic apparatus 100 by hooking fingers of the user or the like on the battery-pack claw portion 14 and applying a force in the +x (plus x) direction to disconnect the battery-pack connection terminals 13 from the housing-portion connection terminals 113 (see FIG. 3).

The battery-pack terminal positioning portion 15 is provided so as to be adjacent to the battery-pack connection terminals 13, and is a positioning portion having a concave receiving structure. As is described later, the housing portion 110 of the electronic apparatus 100 has a housing-portion terminal positioning portion at a position corresponding to the battery-pack terminal positioning portion 15. The housing-portion terminal positioning portion and the battery-pack terminal positioning portion 15 are fitted to each other. Accordingly, the battery-pack connection terminals 13 and the housing-portion connection terminals included in the housing portion 110 of the electronic apparatus 100 can be connected to each other without hindrance.

(1-2. Structure of Housing Portion of Electronic Apparatus)

Figure 3:
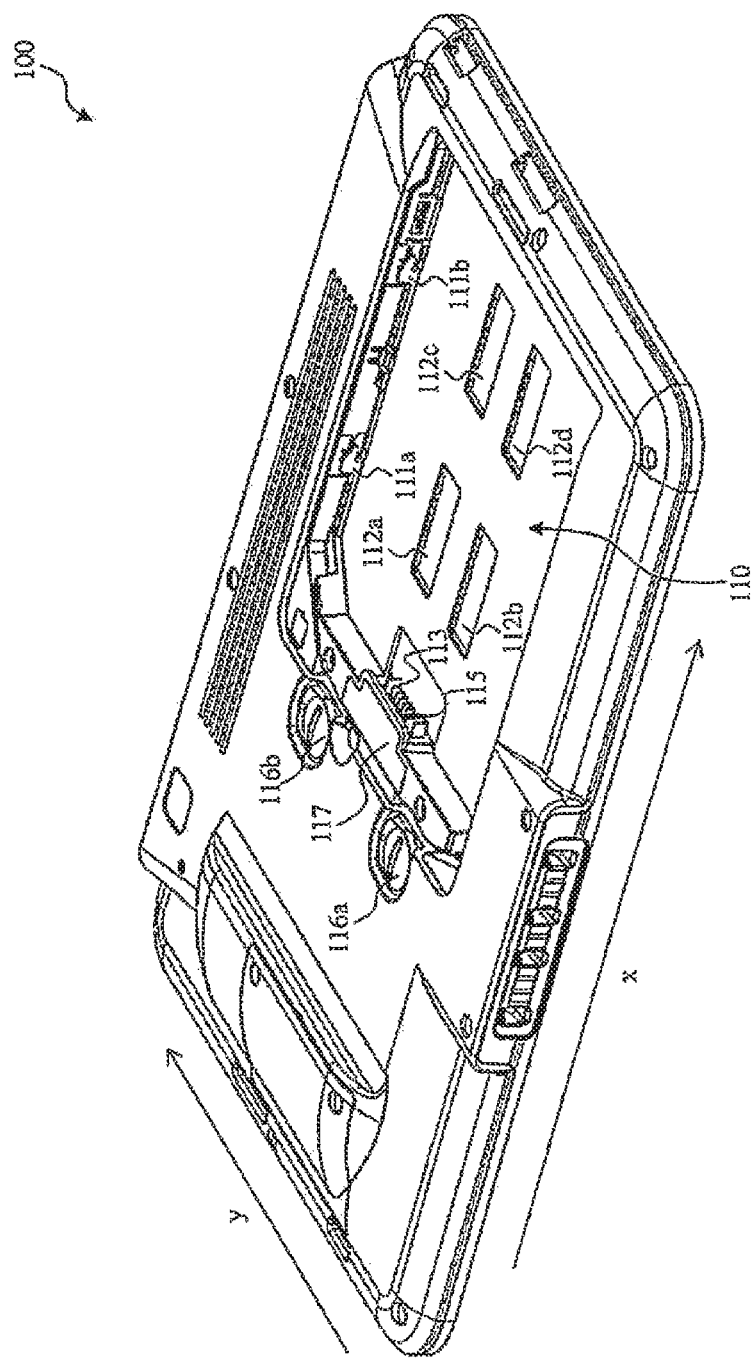
FIG. 3 is a perspective view for illustrating a structure of a housing portion for the battery pack of an electronic apparatus according to the first embodiment.

Next, with reference to FIG. 3, description is made of a structure of the housing portion 110 of the electronic apparatus 100.

With reference to FIG. 3, the housing portion 110 includes four housing-portion side-surface protruding portions 111a to 111d (111c and 111d not shown), four housing-portion bottom-surface groove portions 112a to 112d, the plurality of housing-portion connection terminals 113, a housing-portion terminal positioning portion 115, two fixtures 116a and 116b, and a terminal protection portion 117.

Figure 16:
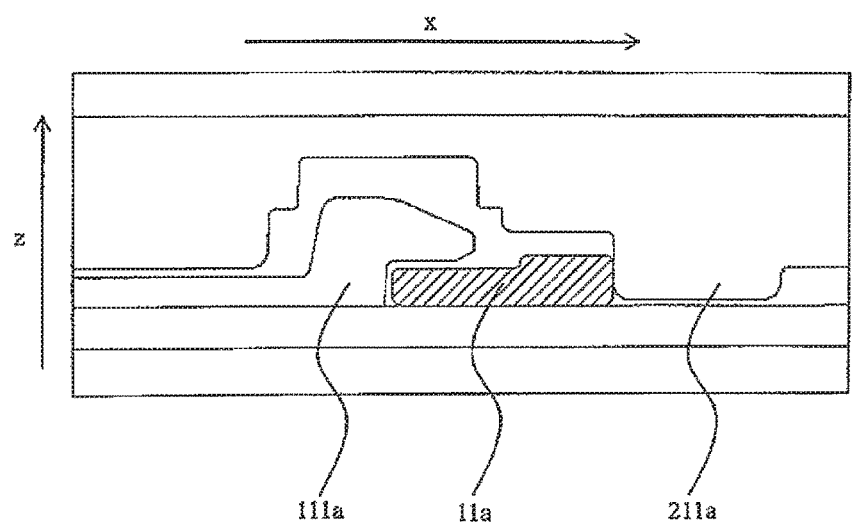
FIG. 16 is a view for illustrating a state in which the battery-pack side-surface protruding portion, the housing-portion side-surface protruding portion, and a cover lower-surface protruding portion are engaged with one another.

The housing-portion side-surface protruding portion 111a and the housing-portion side-surface protruding portion 111b are provided on one side wall of two side walls (side surfaces) of the housing portion along the x direction, and are protruding portions each having a reversed L-shape protruding from the wall surfaces in the −y (minus y) direction. The housing-portion side-surface protruding portion 111a and the housing-portion side-surface protruding portion 111b are provided to positions which enable engagement with the battery-pack side-surface protruding portion 11a and the battery-pack side-surface protruding portion 11b, respectively, when the battery pack 10 is housed in the housing portion 110. Further, the housing-portion side-surface protruding portion 111a and the housing-portion side-surface protruding portion 111b have a structure which enables engagement with the battery-pack side-surface protruding portion 11a and the battery-pack side-surface protruding portion 11b, respectively. For example, as illustrated in FIG. 16, the battery-pack side-surface protruding portion 11a and the housing-portion side-surface protruding portion 111a have a structure in which a L-shaped distal end portion of the battery-pack side-surface protruding portion 11a enters a space formed on a lower side of the projecting portion from the reversed L-shaped rising part in the housing-portion side-surface protruding portion 111a. Further, although details are described later, the housing-portion side-surface protruding portion 111a and the housing-portion side-surface protruding portion 111b have inclination portions on respective upper portions.

Although not shown, the housing-portion side-surface protruding portion 111c and the housing-portion side-surface protruding portion 111d are provided on another side wall of the two side walls of the housing portion along the x direction, and are protruding portions each having a reversed L-shape protruding from the wall surface in the +y (plus y) direction. In the x direction, the housing-portion side-surface protruding portion 111c is provided at the same position as the housing-portion side-surface protruding portion 111a, and the housing-portion side-surface protruding portion 111d is provided at the same position as the housing-portion side-surface protruding portion 111b (see FIG. 11) Further, the housing-portion side-surface protruding portion 111c and the housing-portion side-surface protruding portion 111d are provided to positions which enable engagement with the battery-pack side-surface protruding portion 11c and the battery-pack side-surface protruding portion 11d, respectively, when the battery pack 10 is housed in the housing portion 110. Moreover, the housing-portion side-surface protruding portion 111c and the housing-portion side-surface protruding portion 111d have respective inclination portions similarly to the housing-portion side-surface protruding portion 111a and the housing-portion side-surface protruding portion 111b. The number of the protruding portions provided on the side surfaces of the housing portion 110 is not particularly limited. The shape of the protruding portions is also not particularly limited. The shape only needs to be a shape capable of being engaged with the protruding portions provided on the side surfaces of the battery pack.

Figure 4A:
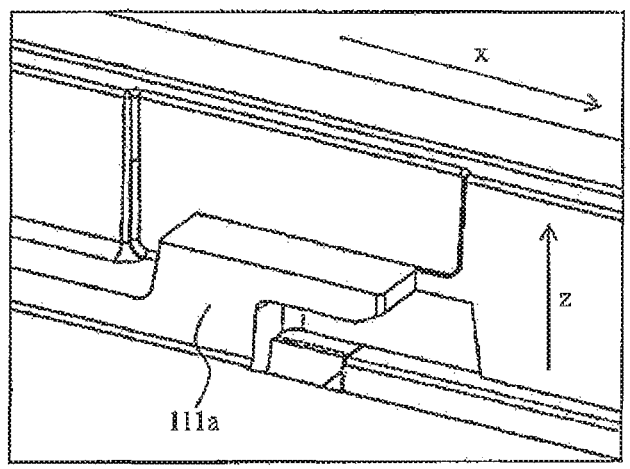
FIGS. 4(a) and 4(b) include 4(a) which is a perspective view for illustrating a housing-portion side-surface protruding portion having no inclination portion and 4(b) which is a perspective view for illustrating a housing-portion side-surface protruding portion having the inclination portion.
Figure 4B:
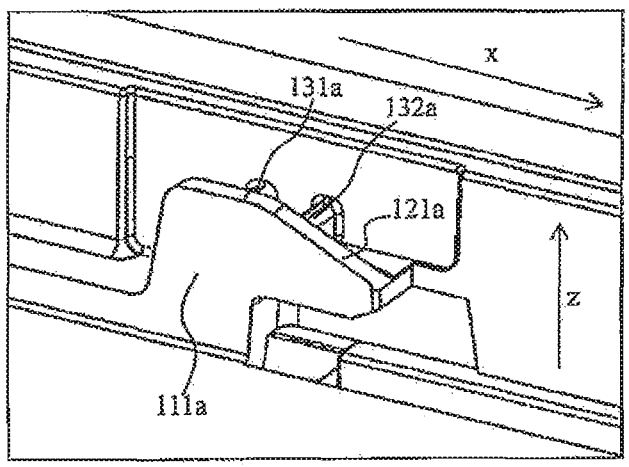

Next, with reference to FIG. 4(a) and FIG. 4(b), detailed description is made of the housing-portion side-surface protruding portions 111a to 111d. FIG. 4(a) and FIG. 4(b) are enlarged views for illustrating the housing-portion side-surface protruding portion 111a.

FIG. 4(a) is an illustration of the housing-portion side-surface protruding portion 111a having no inclination portion, which is described later, in an upper portion thereof. As illustrated in FIG. 4(a), the upper portion of the housing-portion side-surface protruding portion 111a is a flat surface, and has a structure of being parallel to a bottom surface of the housing portion 110. Although not shown, the housing-portion side-surface protruding portions 111b to 111d each have a structure similar to that of the housing-portion side-surface protruding portion 111a. FIG. 4(a) is an illustration given only for easy understanding of the housing-portion side-surface protruding portions 111a to 111d, and the inclination portion described later is provided on each of the upper portions of the housing-portion side-surface protruding portions 111a to 111d according to this invention.

FIG. 4(b) is an illustration of the housing portion protruding portion 111a according to this invention. As illustrated in FIG. 4(b), on the upper portion of the housing-portion side-surface protruding portion 111a, in particular, at a projecting portion extending from a rising part having a reversed L-shape, there is provided an inclination portion 121a being inclined so as to descend along an extending direction (+x (plus x) direction) of the projecting portion.

The inclination portion 121a is inclined toward a side wall which is opposed to the side wall having the housing-portion connection terminal 113. Although description is made later, with the inclination portion 121a, the battery pack housing structure is capable of easily positioning the battery pack 10 at a position before a mounting position (hereinafter referred to as "pre-mounting position") at which the battery-pack connection terminals 13 and the housing-portion connection terminals 113 are connected to each other. Moreover, the inclination portion 121a is connected to the side wall of the housing portion 110 by two ribs, that is, a rib 131a and a rib 132a, and is supported thereat. In FIG. 4(b), there is illustrated only the housing-portion side-surface protruding portion 111a. However, on the upper portions of the housing-portion side-surface protruding portions 111b to 111d, there are provided inclination portions 121b to 121d having same structure as the inclination portion 121a, and the inclination portions 121b to 121d are connected to side walls of the housing portion 110 by two ribs (131b to 131d and 132b to 132d), respectively, and are supported thereat. (see FIG. 11)

Referring back to FIG. 3, the housing-portion bottom-surface groove portion 112a to 112d are grooves formed in a bottom surface of the housing portion 110. The housing-portion bottom-surface groove portion 112a to 112d are provided to positions which enable fitting of the battery-pack lower-surface protruding portion 12a to 12d, respectively, when the battery pack 10 is housed in the housing portion 110. Further, the housing-portion bottom-surface groove portion 112a to 112d have a structure which enables fitting of the battery-pack lower-surface protruding portion 12a to 12d. The housing-portion bottom-surface groove portion 112a to 112d are fitted to the battery-pack lower-surface protruding portion 12a to 12d, respectively, when the battery pack 10 is placed in the housing portion 110 (see FIG. 11). Moreover, the housing-portion bottom-surface groove portions 112a to 112d are provided so that the fitting state is maintained even when the battery-pack connection terminals 13 and the housing-portion connection terminals 113 are brought into a connected state by sliding the battery pack 10 in the −x (minus x) direction while maintaining the fitting state with the battery-pack lower-surface protruding portions 12a to 12d (see FIG. 5). A depth of the housing-portion bottom-surface groove portions 112a to 112d is set so as to be larger than a height of the battery-pack lower-surface protruding portions 12a to 12d. Through fitting of the housing-portion bottom-surface groove portions 112a to 112d of the housing portion 110 with the battery-pack lower-surface protruding portions 12a to 12d, relative positioning of the battery pack 10 and the housing portion 110 is performed, thereby preventing relative displacement of positions of the battery-pack connection terminals 13 of the battery pack 10 and the housing-portion connection terminals 113 of the housing portion 110.

Each of the housing-portion connection terminals 113 is formed of a connection piece (or a pin), which is provided on one side wall of the two housing portion side walls (side surfaces) along the y direction, and has a structure which enables connection to each of the battery-pack connection terminals 13.

The housing-portion terminal positioning portion 115 is a protruding portion provided so as to be adjacent to the plurality of housing-portion connection terminals 113, and has a structure which enables fitting to the concave receiving portion of the battery-pack terminal positioning portion 15 (FIG. 2(b)). Through fitting of the housing-portion terminal positioning portion 115 and the battery-pack terminal positioning portion 15 to each other, the battery-pack connection terminals 13 of the battery pack 10 and the housing-portion connection terminals 113 of the housing portion 110 can be connected to each other without hindrance.

The fixture 116a and the fixture 116b are turnable plate-like members, which are provided so as to be aligned on a surface of the electronic apparatus 100 along one edge of the two edges of the housing portion 110 along they direction. In this case, the fixture 116a and the fixture 116b are provided along the same edge as the edge to which the housing-portion connection terminals 113 are provided. In this case, the fixtures 116a and 116b have projecting portions 116a-1 and 116b-1 and knobs. The projecting portions 116a-1 and 116b-1 are provided at a part of an outer periphery of a circular plate and project parallel to the plate surface. The knobs are provided on an upper surface and extend along a diameter.

Figure 5:
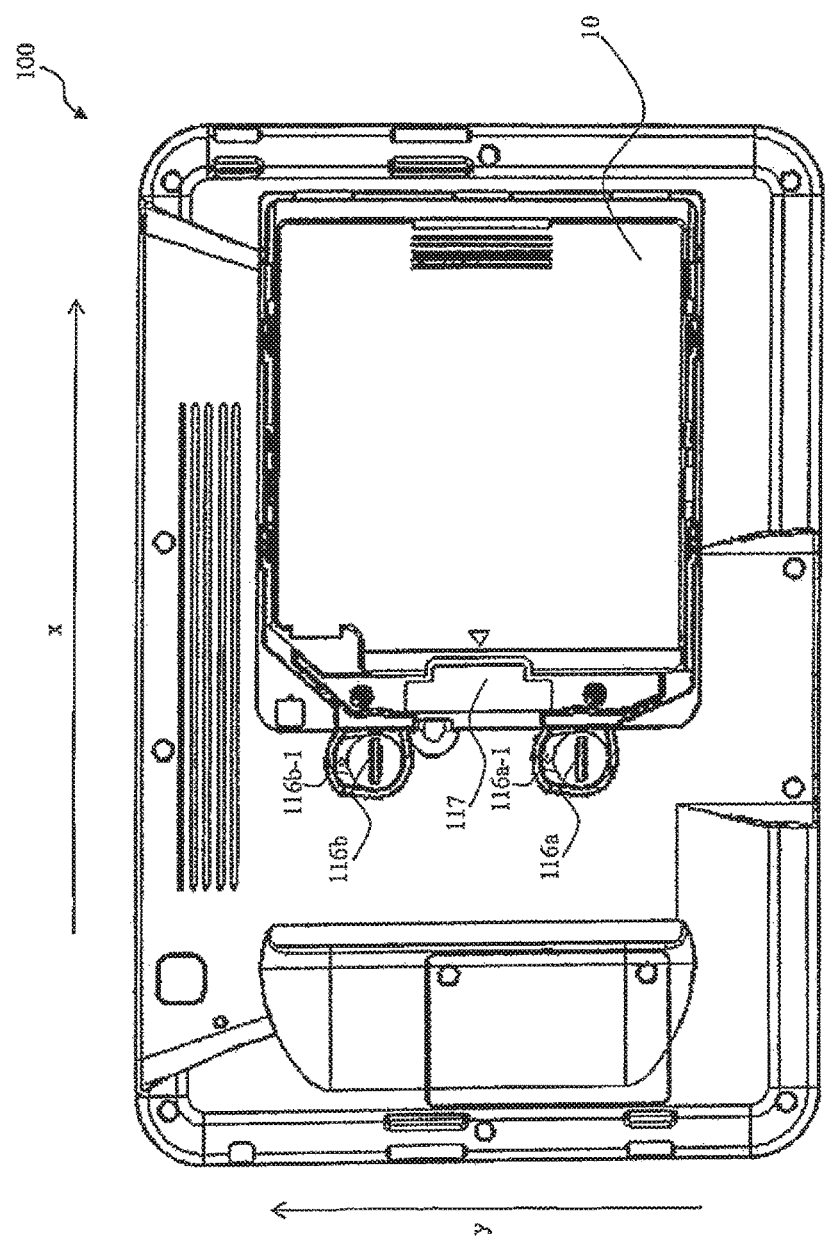
FIG. 5 is a view for illustrating a state in which the battery pack illustrated in FIGS. 2(a) and 2(b) is housed in the electronic apparatus illustrated in FIG. 3.
Figure 17:
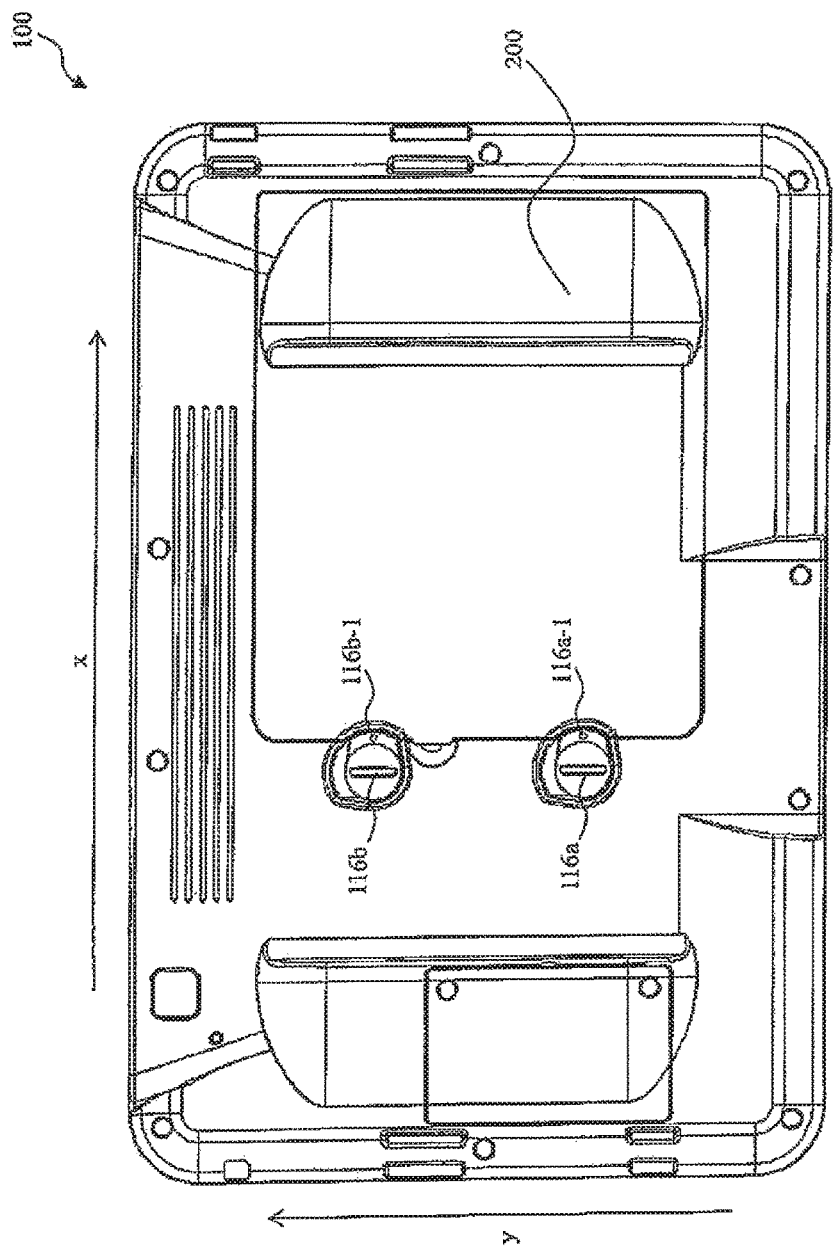
FIG. 17 is a view for illustrating a state in which the battery cover is mounted to the electronic apparatus.

Here, with reference to FIG. 5, description is made of the fixture 116a and the fixture 116b. With reference to FIG. 5, there is illustrated a state in which the battery pack 10 is housed in the housing portion 110 of the electronic apparatus 100. Specifically, FIG. 5 is an illustration of the electronic apparatus 100 in which the battery pack 10 is at the mounting position with the battery-pack connection terminals 13 and the housing-portion connection terminals 113 connected to each other. As illustrated in FIG. 17, the orientations of the knobs are set parallel to the y direction under a state in which the battery cover 200 is mounted to the housing portion 110 so that the projecting portions 116a-1 and 116b-1 are positioned on the battery cover 200. In such a manner, the battery cover 200 can be fixed to the housing portion 110 of the electronic apparatus 100. Further, the orientations of the knobs of the fixtures are set parallel to the x direction so that the projecting portions 116a-1 and 116b-1 are separated from the battery cover 200. In such a manner, the battery cover 200 can be mounted to or removed from the housing portion 110 of the electronic apparatus 100. The shape of each of the fixture 116a and the fixture 116b described above is merely an example, and is not particularly limited.

The terminal protection portion 117 has an eaves-like structure covering a part above the plurality of housing-portion connection terminals 113, and is configured to protect the housing-portion connection terminals 113 from damage or the like as a result of the housing-portion connection terminals 113 being hit by something when the housing portion 110 is opened.

[1-3. Structure of Battery Cover]

Figure 6A:
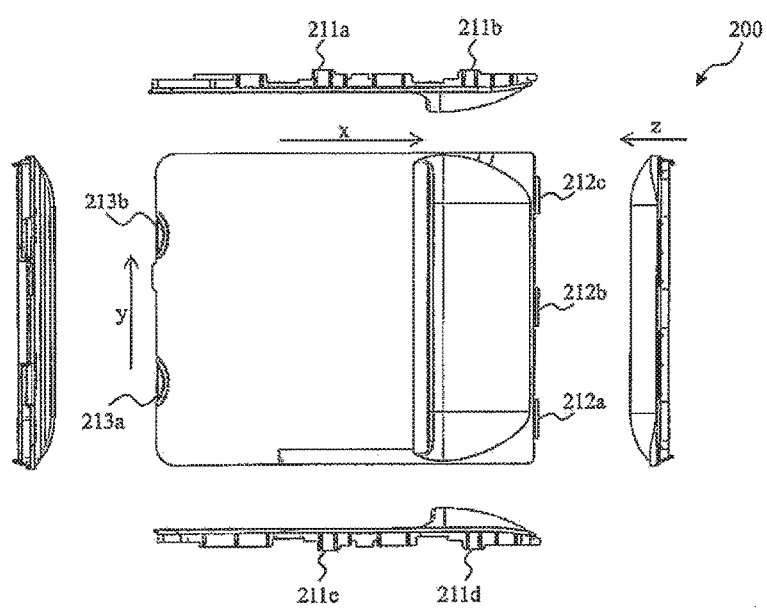
FIGS. 6(a) and 6(b) include 6(a) which is a view for illustrating structures of an upper surface and four side surfaces of a battery cover of the electronic apparatus according to the first embodiment and 6(b) which is a perspective view for illustrating a structure of the battery cover related to the first embodiment.
Figure 6B:
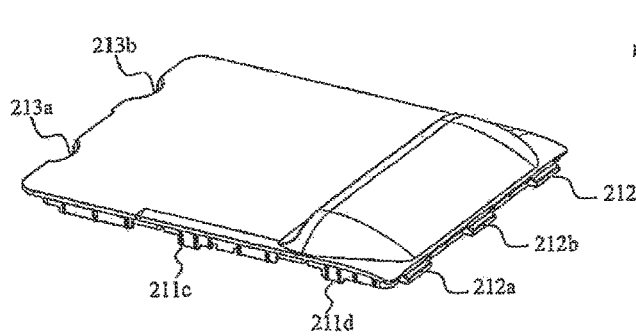

Next, with reference to FIGS. 6(a) and 6(b), description is made of the structure of the battery cover 200.

With reference to FIGS. 6(a) and 6(b), the battery cover 200 includes four cover lower-surface protruding portions 211a to 211d, three cover side-surface protruding portions 212a to 212c, and two cover side-surface stepped portions 213a and 213b.

The cover lower-surface protruding portion 211a and the cover lower-surface protruding portion 211b are provided on a lower surface of the battery cover 200 along an edge of one side surface of two side surfaces along the x direction, and are protruding portions protruding in the −z (minus z) direction. The cover lower-surface protruding portion 211a has a structure capable of being engaged with the battery-pack side-surface protruding portion 11a from the z direction, and is provided to a position which enables engagement with the battery-pack side-surface protruding portion 11a. Similarly, the cover lower-surface protruding portion 211b has a structure which enables engagement with the battery-pack side-surface protruding portion 11b from the z direction, and is provided to a position which enables engagement with the battery-pack side-surface protruding portion 11b.

The cover lower-surface protruding portion 211c and the cover lower-surface protruding portion 211d are provided on a lower surface of the battery cover 200 along an edge of another side surface of two side surfaces along the x direction, and are protruding portions protruding in the −z (minus z) direction. The cover lower-surface protruding portion 211c has a structure which enables engagement with the battery-pack side-surface protruding portion 11c from the z direction, and is provided to a position which enables engagement with the battery-pack side-surface protruding portion 11c. Similarly, the cover lower-surface protruding portion 211d has a structure which enables engagement with the battery-pack side-surface protruding portion 11d from the z direction, and is provided to a position which enables engagement with the battery-pack side-surface protruding portion 11d. The number and the shape of the protruding portions provided on the lower surface of the battery cover 200 are not particularly limited.

Figure 13A:
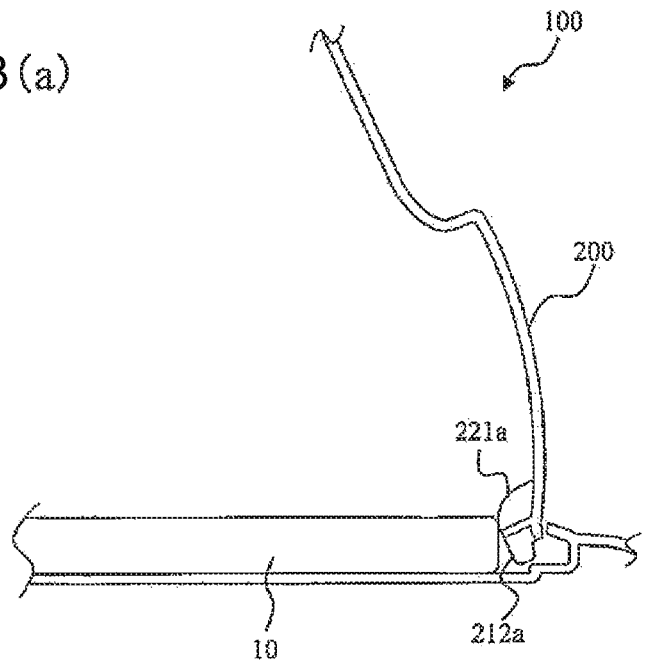
FIGS. 13 (a) and 13(b) include explanatory views for illustrating a method of mounting a battery cover to the electronic apparatus.
Figure 13B:
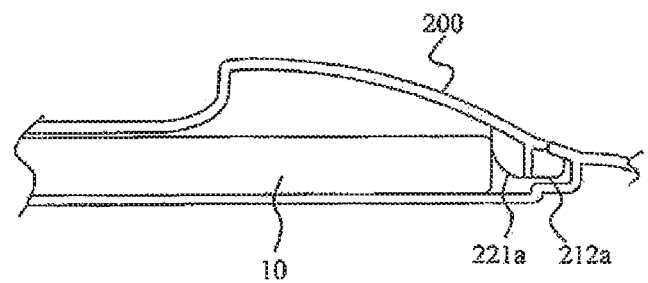

The cover side-surface protruding portion 212a to 212c are provided on one side surface of two side surfaces along the y direction, and are protruding portions protruding in the x direction. The battery cover 200 can be positioned through insertion of the cover side-surface protruding portion 212a to 212c into holes (not shown), which are formed in the side wall (side surface) of the housing portion 110 of the electronic apparatus 100 along the y direction, that is, in the side wall (side surface) opposite to the plurality of housing-portion connection terminals 113. Although details are described later, the cover side-surface protruding portions 212a to 212c each have a battery-pack pushing portion (only one battery-pack pushing portion 221a is illustrated in FIG. 13(a) and 13(b). The battery-pack pushing portions provided on the cover side-surface protruding portions 212a to 212c push the battery pack 10 when the battery cover 200 is mounted to the electronic apparatus 100. As a result, the battery pack 10 moves from the pre-mounting position to the mounting position. That is, with the battery-pack pushing portions provided on the cover side-surface protruding portions 212a to 212c, the position of the battery pack 10 can be shifted from the pre-mounting position to the mounting position by only mounting the battery cover 200.

The cover side-surface stepped portion 213a and the cover side-surface stepped portion 213b are stepped portions provided on a side surface of the battery cover 200 along an edge of another side surface of the two side surfaces along the y direction. Under a state in which the battery cover 200 is set over the housing portion 110, when the knob of each of the fixture 116a and 116b is turned, protruding portions 116a-1 and 116b-1 can be placed on the cover side-surface stepped portion 213a and 213b. In this manner, the cover side-surface stepped portion 213a and the cover side-surface stepped portion 213b are pressed by the fixture 116a and the fixture 116b, respectively. Thus, the battery cover 200 can be fixed to the electronic apparatus 100.

(1-4. Method of Housing Battery Pack)

Figure 7:
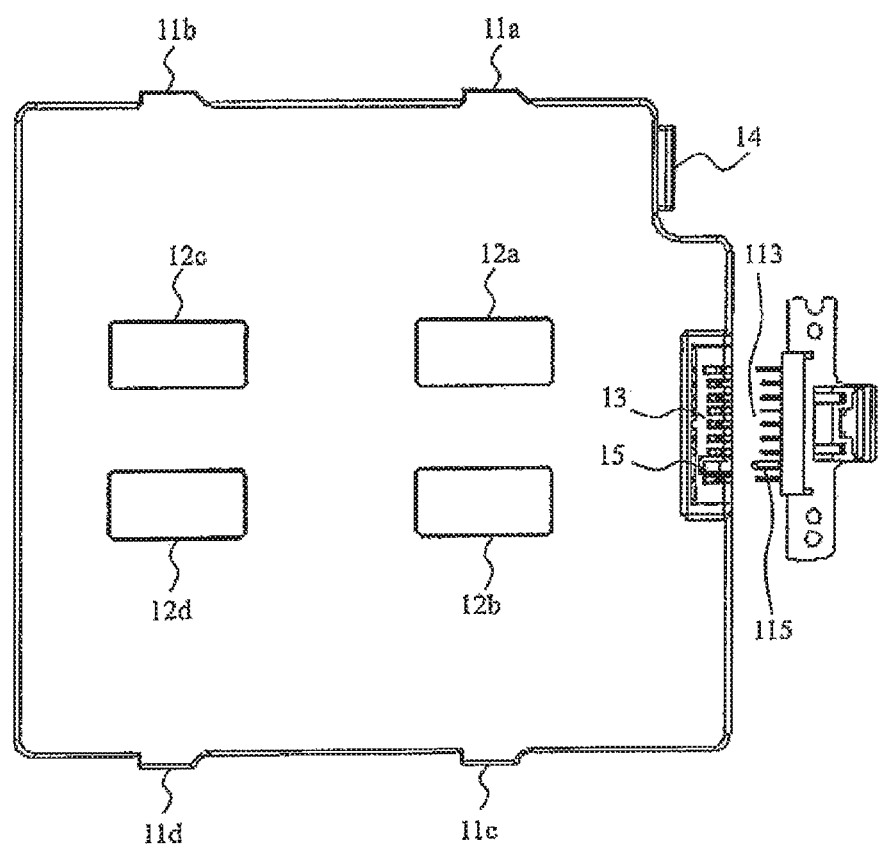
FIG. 7 is a view for illustrating a relationship between connection terminals of the battery pack and connection terminals of the housing portion of the first embodiment, in which the battery pack side is illustrated with its lower surface side oriented upward for easy understanding.

Next, with reference to FIG. 7, FIG. 8, and FIGS 9(a)-9(e), description is made of a method of housing the battery pack 10 in the housing portion 110 of the electronic apparatus 100. FIG. 7 is a view for illustrating a structure of the lower surface of the battery pack 10 related to the first embodiment. In FIG. 7, for easy understanding of a relationship between the battery-pack connection terminals 13 of the battery pack 10 and the housing-portion connection terminals 113 of the housing portion 110, the battery pack 10 is illustrated with its lower surface oriented upward. It is needless to say that, when the battery pack 10 is housed in the housing portion 110, the battery pack 10 is housed with its lower surface oriented downward.

Figure 8:
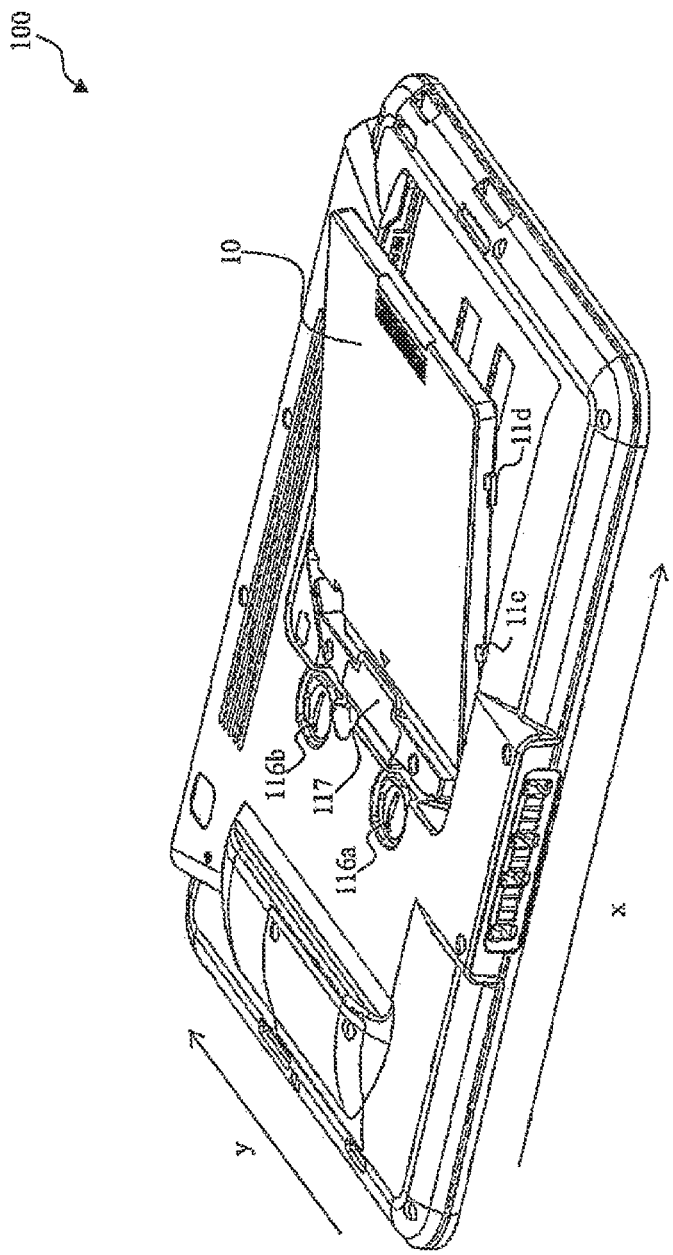
FIG. 8 is an explanatory view for illustrating a method of housing the battery pack in the housing portion.

FIG. 8 is a perspective view for illustrating a method of housing the battery pack 10 in the housing portion 110. As illustrated in FIG. 8, in order to house the battery pack 10 in the housing portion 110, a user first obliquely inserts the battery pack 10 to a position under the terminal protection portion 117 while holding the battery pack 10 with a hand (not shown) or the like so that the battery-pack terminal positioning portion 15 of the battery pack 10 and the housing-portion terminal positioning portion 115 match with each other.

Next, with reference to FIG. 9(a) to FIG. 9(e), description is made of a method of positioning the battery pack 10 to the pre-mounting position.

FIG. 9(a) is an illustration of a positional relationship between the battery-pack connection terminal 13 and the housing-portion connection terminal 113 when the battery pack 10 is to be housed in the housing portion 110. That is, FIG. 9(a) is an illustration of a positional relationship between the battery-pack connection terminal 13 and the housing-portion connection terminal 113 in the state of FIG. 8. FIG. 9(a) is an illustration of a positional relationship given when the battery-pack connection terminal 13 is deeply inserted into the housing-portion connection terminal 113. FIG. 9(b) is an illustration of a positional relationship which is given when the battery-pack connection terminal 13 is not inserted into the housing-portion connection terminal 113 while the battery-pack terminal positioning portion 15 of the battery pack 10 matches with the housing-portion terminal positioning portion 115. The state of FIG. 8 may be the state illustrated in FIG. 9(a) or the state illustrated in FIG. 9(b). Alternatively, the state of FIG. 8 may be an intermediate state between the state illustrated in FIG. 9(a) and the state illustrated in FIG. 9(b).

FIG. 9(c) is an illustration of a state in which the battery pack 10 falls down by its own weight after a user releases a hand from the battery pack 10 so that the battery-pack side-surface protruding portion 11a and the inclination portion 121a are brought into abutment against each other from the state in FIG. 8. Although not shown, at this time, the battery-pack side-surface protruding portion 11c is also brought into abutment against the inclination portion 121c. Further, at this timing, the battery pack 10 is in an inclined state, and hence the battery-pack side-surface protruding portions 11b and 11d are not held in abutment against the inclination portions 121b and 121d. When the battery pack 10 is brought into a horizontal state, the battery-pack side-surface protruding portions 11b and 11d are also brought into abutment against the inclination portions 121b and 121d.

FIG. 9(d) is an illustration of a state after the state of FIG. 9(c). As illustrated in FIG. 9(d), the battery-pack side-surface protruding portion 11a is held in abutment against the inclination portion 121a, and the battery-pack side-surface protruding portion 11c is held in abutment against the inclination portion 121c. Thus, the battery pack 10 slides along the inclination portion 121a and the inclination portion 121c. As a result, the battery pack 10 moves in a direction opposite to the side wall having the housing-portion connection terminal 113.

FIG. 9(e) is an illustration of a state in which the battery pack 10 is further moved from the state illustrated in FIG. 9(d). As illustrated in FIG. 9(e), the battery-pack side-surface protruding portion 11a further slips along the inclination portion 121a, and the battery-pack side-surface protruding portion 11c slips along the inclination portion 121c. With this action, the battery pack 10 slips off from the inclination portions 121a and 121c to be positioned at the pre-mounting position. When the battery pack 10 is positioned at the pre-mounting position, the battery-pack lower-surface protruding portions 12a to 12d are fitted to the housing-portion bottom-surface groove portions 112a to 112d, respectively. In this manner, movement of the battery pack 10 in the y direction is restricted, and the battery pack 10 is positioned in the housing portion 110. That is, in the first embodiment, the battery-pack lower-surface protruding portion 12a to 12d are used for positioning of the battery pack 10, and the battery pack 10 is housed in the housing portion 110.

Figure 10:
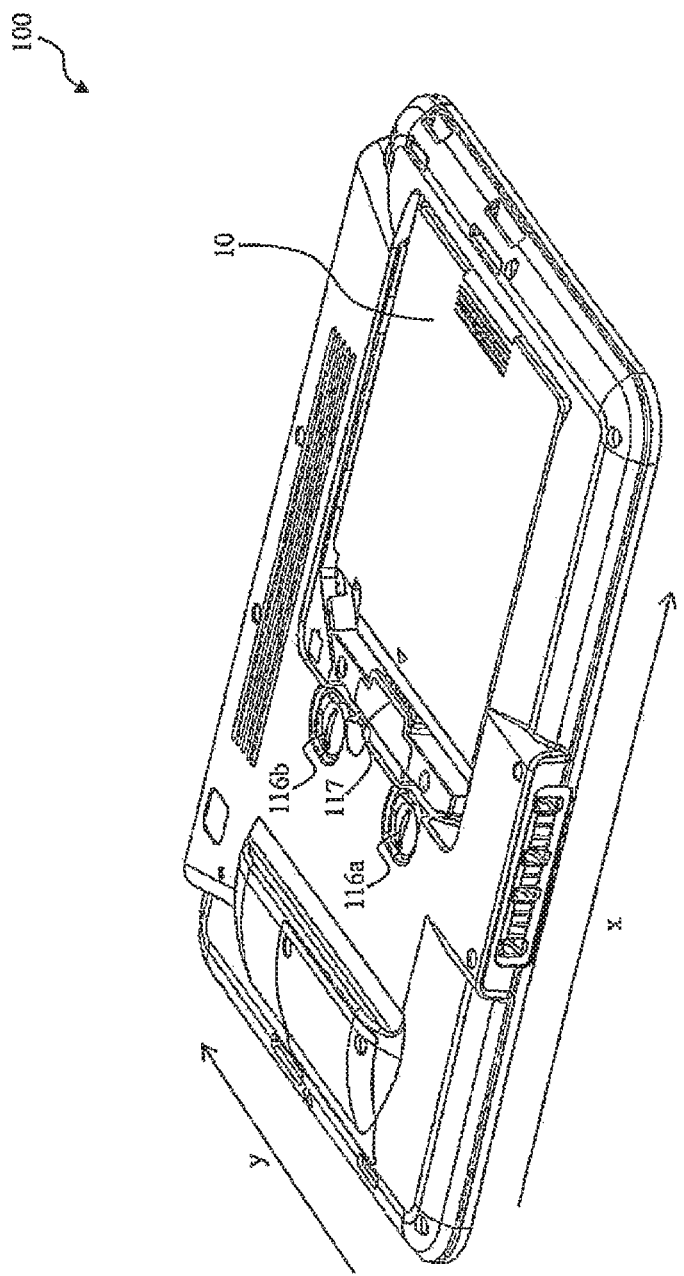
FIG. 10 is a perspective view for illustrating a state in which the battery pack is positioned at a pre-mounting position.
Figure 11:
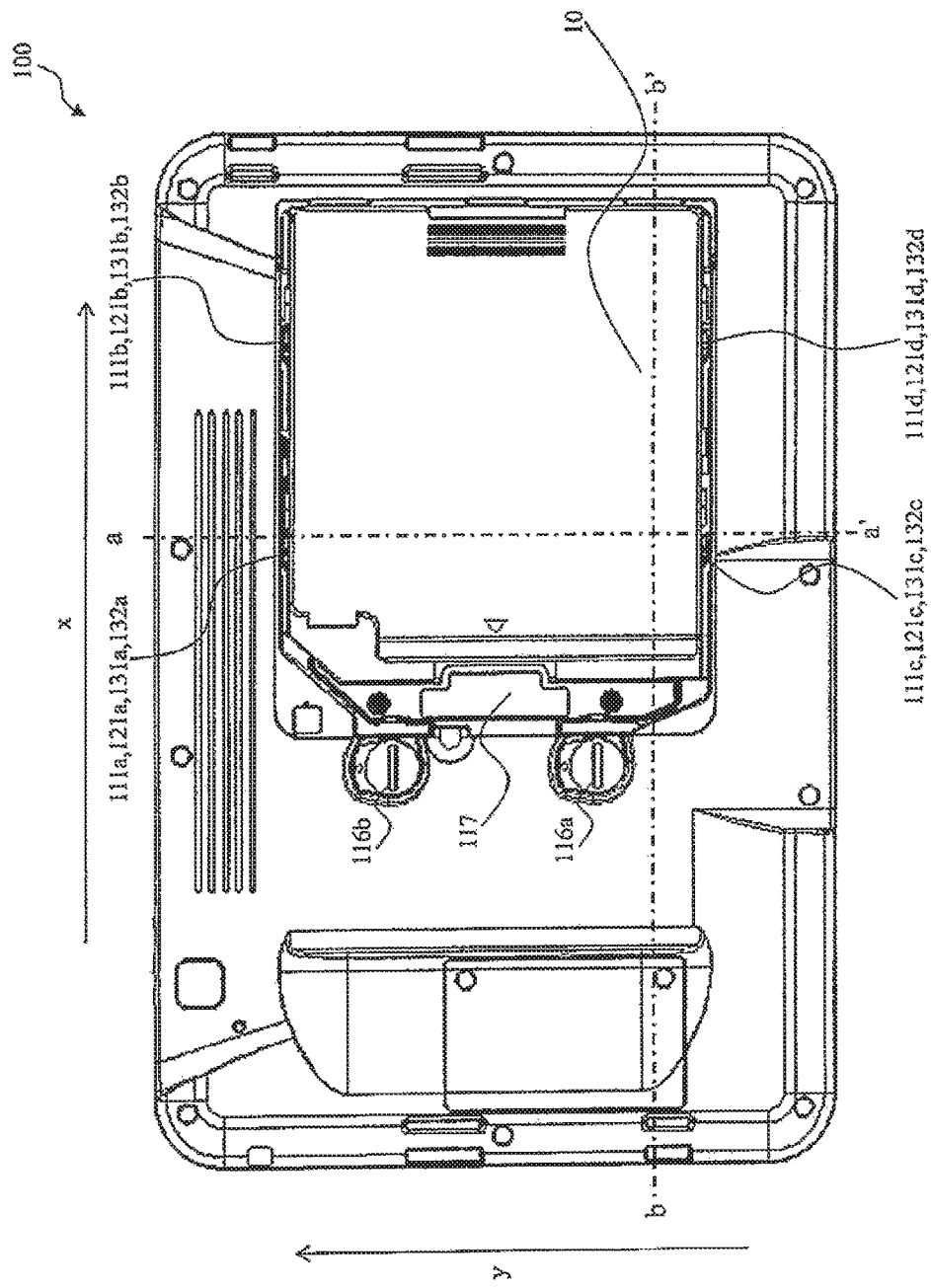
FIG. 11 is a top view for illustrating a state in which the battery pack is positioned at the pre-mounting position.

FIG. 10 and FIG. 11 are views for illustrating the electronic apparatus 100 in which the battery pack 10 is positioned at the pre-mounting position. Specifically, FIG. 10 is a perspective view for illustrating a state in which the battery pack 10 is positioned at the pre-mounting position. FIG. 11 is a top view for illustrating the state in which the battery pack 10 is positioned at the pre-mounting position. As illustrated in FIG. 10 and FIG. 11, when the battery pack 10 is positioned at the pre-mounting position, the battery-pack connection terminals 13 and the housing-portion connection terminals 113 are not connected to each other. In the state illustrated in FIG. 10 and FIG. 11, the battery pack 10 can be positioned at the mounting position by pushing the battery pack 10 in the -x (minus x) direction. Although description is made later, according to this invention, with the battery-pack pushing portions provided to the cover side-surface protruding portions 212a to 212c of the battery cover 200, when the battery cover 200 is mounted while the battery pack 10 is positioned at the pre-mounting position, the battery pack 10 can be shifted to the mounting position.

Figure 12:
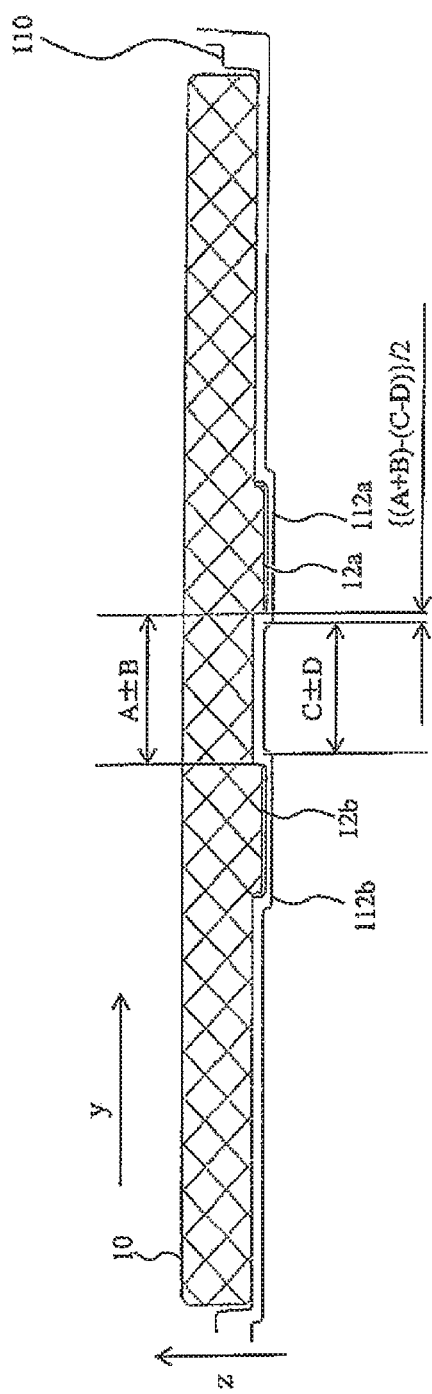
FIG. 12 is a sectional view taken along the line a-a' illustrated in FIG. 11.

FIG. 12 is a sectional view taken along the line a-a' of FIG. 11 when the battery pack of the first embodiment is housed.

With reference to FIG. 12, description is made of effects of positioning of the battery pack 10 of this invention in detail. A dimension between the battery-pack lower-surface protruding portion 12a and the battery-pack lower-surface protruding portion 12b is denoted by A, and a dimensional tolerance thereof is denoted by ±B. A dimension between the housing-portion bottom-surface groove portion 112a and the housing-portion bottom-surface groove portion 112b is denoted by C, and a dimensional tolerance thereof is denoted by ±D. In this case, a gap resulting from a dimensional difference of (A+B)−(C−D) at maximum is formed. That is, in this invention, even when the battery pack 10 is large in size, a gap resulting from the dimensional difference in the y direction can be reduced by housing the battery pack 10 in the housing portion 110 through use of the battery-pack lower-surface protruding portions (12a and 12b) for positioning. As a result, the relative positional displacement of the battery-pack terminal positioning portion 15 and the housing-portion terminal positioning portion 115 can be suppressed, and the battery pack 10 can be housed in the housing portion 110. Although not shown, also though fitting of the battery-pack lower-surface protruding portion 12c and the battery-pack lower-surface protruding portion 12d to the housing-portion bottom-surface groove portion 112c and housing-portion bottom-surface groove portion 112d, respectively, the relative positional displacement of the battery-pack terminal positioning portion 15 and the housing-portion terminal positioning portion 115 can be suppressed.

Next, while keeping the state of being positioned, the battery pack 10 is moved in the -x (minus x) direction. Accordingly, the plurality of battery-pack connection terminals 13 and the plurality of housing-portion connection terminals 113 are connected to each other, and the battery-pack side-surface protruding portions 11a to 11d are engaged with the housing-portion side-surface protruding portions 111a to 111d, respectively. Specifically, through mounting of the battery cover 200 to the electronic apparatus 100, the battery pack 10 can be moved in the -x (minus x) direction, thereby being capable of engaging the battery-pack side-surface protruding portions 11a to 11d with the housing-portion side-surface protruding portions 111a to 111d, respectively.

FIG. 13(a) and FIG. 13(b) are explanatory views for illustrating the method of mounting the battery cover 200 to the electronic apparatus 100. Specifically, FIG. 13(a) is a sectional view for illustrating a state before the battery cover 200 is mounted to the electronic apparatus 100. FIG. 13(b) is a sectional view for illustrating a state after the battery cover 200 is mounted to the electronic apparatus 100. FIG. 13(a) and FIG. 13(b) are partial sectional views taken along the line b-b' of FIG. 11. Only a part of an outer shape of the battery pack 10 is illustrated, and only parts of the housing portion 110 and the battery cover 200 are illustrated. With reference to FIG. 13(a) and FIG. 13(b), the battery cover 200 includes the cover side-surface protruding portion 212a and the battery-pack pushing portion 221a at an edge corresponding to a side surface which is opposed to the side surface having the housing-portion connection terminals 113 among the side surfaces of the housing portion 110. In particular, the battery-pack pushing portion 221a protrudes toward the side opposite to the cover side-surface protruding portion 212a, that is, in the −x (minus x) direction. Although not shown, similarly, the battery-pack pushing portion 221b is provided on the side opposite to the cover side-surface protruding portion 212b, and the battery-pack pushing portion 221c is provided on the side opposite to the cover side-surface protruding portion 212c.

As illustrated in FIG. 13(a), in order to mount the battery cover 200 to the electronic apparatus 100, the cover side-surface protruding portion 212a is inserted into a hole portion formed in the side wall of the housing portion 110. At this time, although not shown, the cover side-surface protruding portions 212b and 212c are also similarly inserted into hole portions formed in the side wall of the housing portion 110. Through insertion of the cover side-surface protruding portions 212a, 212b, and 212c into the hole portions, the cover side-surface protruding portions 212a, 212b, and 212c are brought into contact with the battery pack 10, and the battery-pack pushing portions 221a, 221b, and 221c are thereafter brought into contact with the battery pack 10. Thus, the battery pack 10 is pushed by the battery-pack pushing portions 221a, 221b, and 221c to slightly move toward the mounting position.

Next, as illustrated in FIG. 13(b), under a state in which the cover side-surface protruding portions 212a, 212b, and 212c are inserted into the hole portions, the battery cover 200 is turned in a closing direction about the cover side-surface protruding portions 212a, 212b, and 212c being support points, thereby covering the battery pack 10 with the battery cover 200 to be mounted. As a result, the battery-pack pushing portions 221a, 221b, and 221c push the battery pack 10, and the battery pack 10 moves to the mounting position. Thus, the battery-pack connection terminals 13 and the housing-portion connection terminals 113 are connected to each other. At this time, the battery-pack lower-surface protruding portions 12a to 12d move along the housing-portion bottom-surface groove portions 112a to 112d, respectively, thereby being capable of suppressing the relative positional displacement of the battery-pack terminal positioning portion 15 and the housing-portion terminal positioning portion 115. Further, mounting of the battery cover 200 allows the battery-pack side-surface protruding portions 11a to 11d, the housing-portion side-surface protruding portions 111a to 111d, and the battery cover side-surface protruding portions 211a to 211d to be engaged, respectively. (see FIG. 16)

Figure 14:
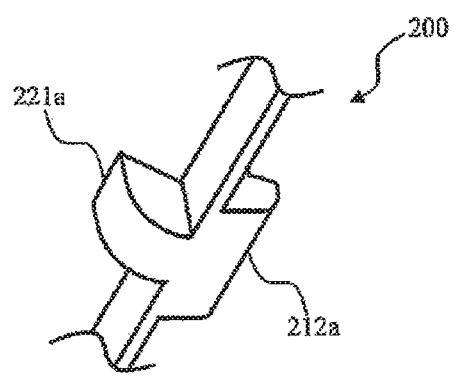
FIG. 14 is a perspective view for illustrating an example of a battery-pack pushing portion in the embodiment of this invention, which is provided to the battery cover.

FIG. 14 is a view for illustrating an example of a structure of the battery-pack pushing portions 221a, 221b, and 221c. The battery-pack pushing portions 221a, 221b, and 221c have the same shape, and hence only one battery-pack pushing portion is illustrated. As illustrated in FIG. 14, the battery-pack pushing portions 221a, 221b, and 221c are provided on a surface on a side opposite to a surface on which the cover side-surface protruding portions 212a, 212b, and 212c are provided, which is a side surface of the battery cover 200 corresponding to the side surface of the housing portion 110 opposed to the side surface having the housing-portion connection terminals 113. Further, the battery-pack pushing portions 221a, 221b, and 221c each have a sectional shape obtained by dividing a circle into quadrisections. In such battery-pack pushing portions 221a, 221b, and 221c, a surface in contact with the battery pack 10 at the time of pushing the battery pack 10 is curved and smooth. Thus, the battery pack 10 can be moved to the mounting position without damaging the battery pack 10. The shape of the battery-pack pushing portions 221a, 221b, and 221c illustrated in FIG. 14 is an example, and the shape of the battery-pack pushing portions 221a, 221b, and 221c is not limited. It is only required that the battery-pack pushing portions 221a, 221b, and 221c have a shape which enables movement of the battery pack 10 from the pre-mounting position to the mounting position.

FIG. 15(a) and FIG. 15(b) are views for illustrating, with the battery pack 10 arranged opposed above the electronic apparatus 100, a positional relationship between the battery-pack connection terminals 13 and the housing-portion connection terminals 113 and a positional relationship between the battery-pack side-surface protruding portions 11a to 11d and the housing-portion side-surface protruding portions 111a to 111d. With regard to the electronic apparatus 100, a sectional view of the housing portion 110 is illustrated. Specifically, FIG. 15(a) is an illustration of a positional relationship between the battery-pack connection terminals 13 and the housing-portion connection terminals 113 and a positional relationship between the battery-pack side-surface protruding portions 11a to 11d and the housing-portion side-surface protruding portions 111a to 111d, which are given when the battery pack 10 is at the pre-mounting position. FIG. 15(b) is an illustration of a positional relationship between the battery-pack connection terminals 13 and the housing-portion connection terminals 113 and a positional relationship between the battery-pack side-surface protruding portions 11a to 11d and the housing-portion side-surface protruding portions 111a to 111d, which are given when the battery pack 10 is moved to the mounting position through mounting of the battery cover 200. As illustrated in FIG. 15(a) and FIG. 15(b), at the pre-mounting position, the battery-pack connection terminals 13 and the housing-portion connection terminals 113 are not connected to each other. However, through movement of the battery pack 10 to the mounting position, the battery-pack connection terminals 13 and the housing-portion connection terminals 113 are connected to each other. Moreover, as illustrated in FIG. 15(b), even in the state of FIG. 9(a) described above, the battery-pack side-surface protruding portions 11a to 11d are brought into contact with parts of the inclination portions 121a to 121d which are inclined so as to descend along the +x (plus x) direction. Thus, the battery pack 10 slips off along the inclination portions 121a to 121d, and is positioned at the pre-mounting position.

FIG. 16 is an illustration of a state in which the battery-pack side-surface protruding portion 11a, the housing-portion side-surface protruding portion 111a, and the cover lower-surface protruding portion 211a are engaged in the state of FIG. 13(b) described above, that is, under the state in which the battery cover 200 is mounted and the battery pack 10 is at the mounting position. Specifically, first, an L-shaped distal end portion of the battery-pack side-surface protruding portion 11a enters a space formed on a lower side of the projecting portion from the reversed L-shaped rising part in the housing-portion side-surface protruding portion 111a so that the battery-pack side-surface protruding portion 11a is engaged with the housing-portion side-surface protruding portion 111a. Next, the housing portion 110 housing the battery pack 10 is covered with the battery cover 200. Thus, the cover lower-surface protruding portion 211a provided to the battery cover 200 is engaged with the battery-pack side-surface protruding portion 11a and the housing-portion side-surface protruding portion 111a from above.

Description is made again of the process of attaining the state of FIG. 16. First, after supporting and inserting the battery pack 10 into the housing portion 110 by hand, a hand is released to bring the battery pack 10 to the pre-mounting position. Next, the battery cover 200 is mounted. Finally, the orientations of the knobs of the fixture 116a and the fixture 116b are set parallel to the y direction. By the process described above, mounting of the battery pack 10 to the electronic apparatus 100 is completed. FIG. 17 is an illustration of the electronic apparatus 100 to which the battery cover 200 is mounted.

Subsequently, with reference to FIG. 16, description is made of a structure of the battery pack housing structure which keeps the battery pack 10, which is housed in the housing portion 110, so as not to be moved.

First, description is made of a structure for restricting movement of the battery pack 10 in the x direction.

With reference to FIG. 16, as described above, the L-shaped distal end portion of the battery-pack side-surface protruding portion 11a enters the space formed on a lower side of the projecting portion from the reversed L-shaped rising part in the housing-portion side-surface protruding portion 111a. Accordingly, the housing-portion side-surface protruding portion 111a restricts movement of the battery-pack side-surface protruding portion 11a in the −x (minus x) direction. Further, the battery-pack side-surface protruding portion 11a is engaged with the cover lower-surface protruding portion 211a from the z direction, thereby restricting movement in the +x (plus x) direction. That is, movement of the battery-pack side-surface protruding portion 11a in the x direction is restricted by the housing-portion side-surface protruding portion 111a and the cover lower-surface protruding portion 211a. The same holds true for the battery-pack side-surface protruding portions 11b to 11d. Thus, movement of the battery pack 10 in the x direction is restricted.

Next, description is made of a structure for restricting movement of the battery pack 10 in the z direction.

As described above, the L-shaped distal end portion of the battery-pack side-surface protruding portion 11a enters the space formed on a lower side of the projecting portion from the reversed L-shaped rising part in the housing-portion side-surface protruding portion 111a. Thus, the housing-portion side-surface protruding portion 111a restricts movement of the battery-pack side-surface protruding portion 11a in the z direction. The same holds true for the battery-pack side-surface protruding portions 11b to 11d. Therefore, movement of the battery pack 10 in the z direction is restricted.

In the above-mentioned state, movement of the battery pack 10 in the y direction is restricted through fitting of the housing-portion bottom-surface groove portions 112a to 112d of the housing portion 110 to the battery-pack lower-surface protruding portions 12a to 12d.

Movement of the battery pack 10 in the x direction, the y direction, and the z direction is restricted. Thus, the battery pack 10 is prevented from moving in the housing portion 110 due to a shock or the like, thereby being capable of preventing damage on the battery-pack connection terminals 13 and the housing-portion connection terminals 113. In the related art, movement of the battery pack in the housing portion is restricted through use of a protection member such as a cushion. However, a retention force exerted by the protection member becomes weaker as time elapses. Accordingly, there is a fear in that, when the protection member is used for a long period of time, connection between the plurality of connection terminals provided to the battery pack and the plurality of connection terminals provided to the housing portion may be cut. Meanwhile, in the first embodiment, the protruding portions provided to the battery pack 10 and the protruding portions provided to the housing portion 110 are engaged with each other. Accordingly, movement of the battery pack 10 in the x direction, the y direction, and the z direction is restricted. Therefore, according to this invention, the protection member, which is used in the related art, is not required. A retention force, which is exerted by the protruding portions provided to the battery pack 10 and the protruding portions provided to the housing portion 110, does not become weaker as time elapses, unlike the protection member. Thus, this invention enables use for a long period of time, and is excellent in terms of cost.

[2. Second Embodiment]

Figure 18:
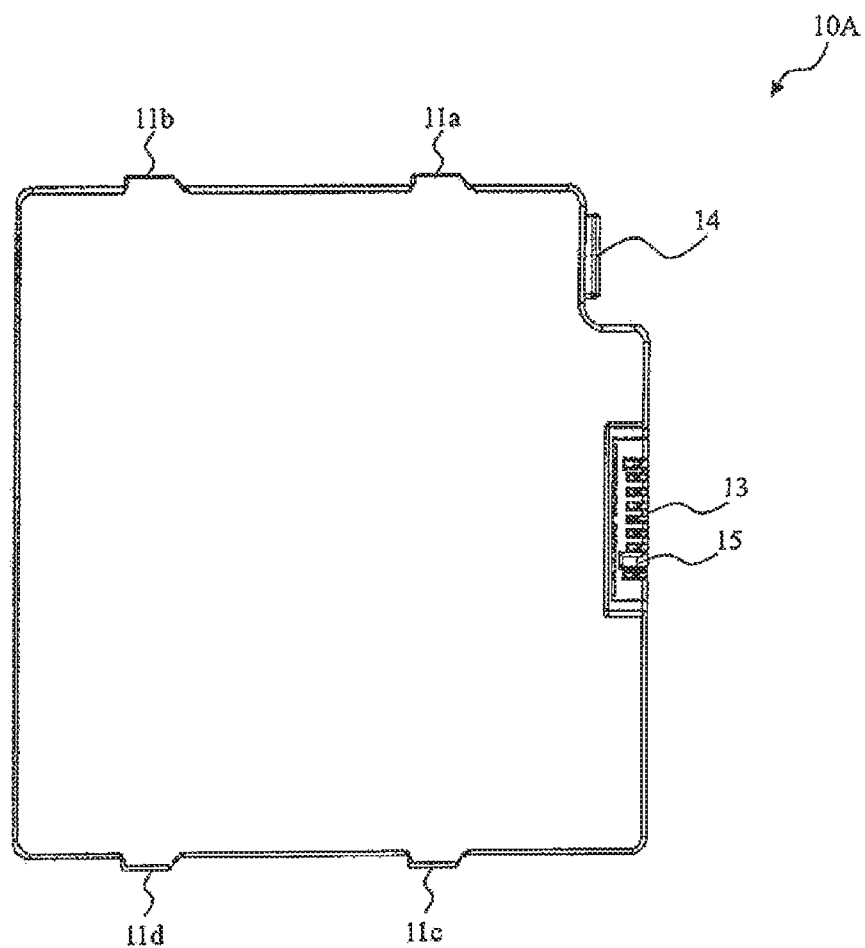
FIG. 18 is a view for illustrating a battery pack in a second embodiment of this invention as seen from its lower surface.
Figure 19:
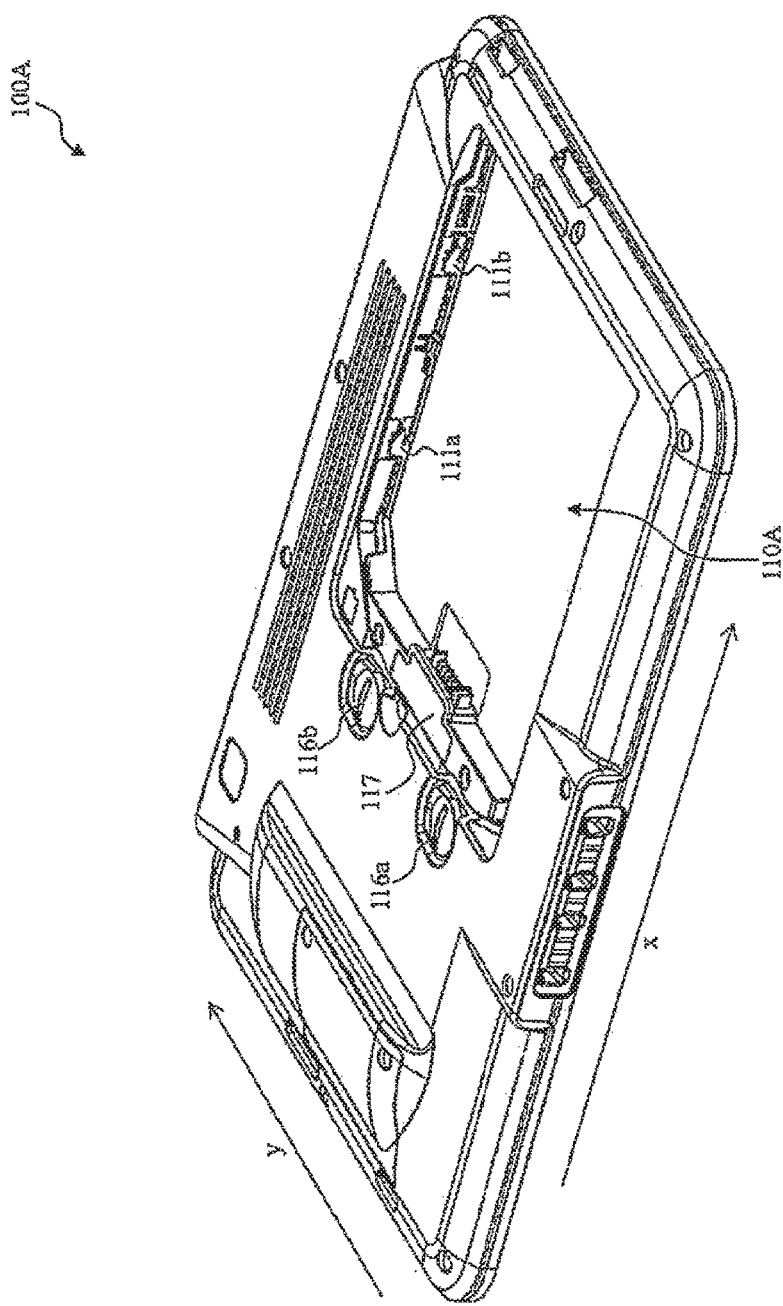
FIG. 19 is a perspective view for illustrating a structure of a housing portion of an electronic apparatus according to the second embodiment.

Next, with reference to FIG. 18 and FIG. 19, description is made of structures of a battery pack 10A, an electronic apparatus 100A, and a housing portion 110A according to a second embodiment of this invention. The second embodiment is different from the first embodiment in that the battery pack 10A does not have the battery-pack lower-surface protruding portions and in that the housing portion 110A of the electronic apparatus 100A does not have the housing-portion bottom-surface groove portions, but other features are the same.

FIG. 18 is a view for illustrating the battery pack 10A in the second embodiment as seen from its lower surface. As illustrated in FIG. 18, unlike the battery pack 10 in the first embodiment, the battery-pack lower-surface protruding portion 12a to 12d are not provided to the lower surface of the battery pack 10A. Thus, the lower surface of the battery pack 10A is a flat surface.

FIG. 19 is a perspective view for illustrating the electronic apparatus 100A according to the second embodiment. As illustrated in FIG. 19, unlike the housing portion 110 in the first embodiment, the housing-portion bottom-surface groove portions 112a to 112d are not formed in the bottom surface of the housing portion 110A of the electronic apparatus 100A. Thus, the bottom surface of the housing portion 110A is a flat surface.

That is, in the second embodiment, the battery-pack lower-surface protruding portions 12a to 12d and the housing-portion bottom-surface groove portion 112a to 112d are not used to suppress the relative positional displacement of the battery-pack terminal positioning portion 15 and the housing-portion terminal positioning portion 115.

Alternatively, in the second embodiment, there are used the side surface having the battery-pack side-surface protruding portions of the battery pack 10A and wall surfaces of the housing-portion side-surface protruding portions 111a to 111d of the housing portion 110A which are opposed to the side surface having the battery-pack side-surface protruding portions of the battery pack 10A when the battery pack 10A is housed in the housing portion 110A. With this configuration, the relative positional displacement of the battery-pack terminal positioning portion 15 and the housing-portion terminal positioning portion 115 is suppressed, and the movement in the y direction of the battery pack 10A housed in the housing portion 110A is restricted. Also in the second embodiment, the actions and effects similar to those of the first embodiment can be achieved.

In the above, description is made of this invention with reference to the plurality of embodiments. However, this invention is not limited to the embodiments described above. Configurations and details of this invention can be modified in various ways which can be understood by a person skilled in the art within the spirit and scope of this invention described in claims.

INDUSTRIAL APPLICABILITY

This invention is suitably applied to general portable electronic apparatuses including a battery pack being an electric power supply source and being removably mounted.

REFERENCE SIGNS LIST 10, 10A . . . battery pack
11a, 11b, 11c, 11d . . . battery-pack side-surface protruding portion
12a, 12b, 12c, 12d . . . battery-pack lower-surface protruding portion
13 . . . battery-pack connection terminal
14 . . . battery-pack claw portion
15 . . . battery-pack terminal positioning portion
100, 100A . . . electronic apparatus
101 . . . display with touch panel
110, 110A . . . housing portion
111a, 111b, 111c, 111d . . . housing-portion side-surface protruding portion
112a, 112b, 112c, 112d . . . housing-portion bottom-surface groove portion
113 . . . housing-portion connection terminal
115 . . . housing-portion terminal positioning portion
116a, 116b . . . fixture
117 . . . terminal protection portion
121a, 121b, 121c, 121d . . . inclination portion
131a, 131b, 131c, 131d . . . rib
132a, 132b, 132c, 132d . . . rib
200 . . . battery cover
211a, 211b, 211c, 211d . . . cover lower-surface protruding portion
212a, 212b, 212c . . . cover side-surface protruding portion
213a, 213b . . . cover side-surface stepped portion
221a, 221b, 221c . . . battery-pack pushing portion.

The invention claimed is:

1. A battery pack housing structure, which is used for an electronic apparatus including a housing portion for housing a battery pack, comprising a battery cover configured to cover the housing portion which houses the battery pack,
wherein the battery pack has a substantially rectangular flat-plate shape, and includes a connection terminal provided to a first side surface and battery-pack side-surface protruding portions provided to a second side surface and a third side surface adjacent to the first side surface,
wherein the housing portion includes:
a bottom surface corresponding to a lower surface of the battery pack;
a housing-portion connection terminal provided to a first housing-portion side surface being a side surface corresponding to the first side surface; and
housing-portion side-surface protruding portions which are engageable with the battery-pack side-surface protruding portions and which are provided to a second housing-portion side surface being a side surface corresponding to the second side surface and a third housing-portion side surface being a side surface corresponding to the third side surface, respectively,
wherein the housing-portion side-surface protruding portions have inclination portions on upper portions thereof, the inclination portions being inclined downward in a direction toward a fourth housing-portion side surface opposed to the first housing-portion side surface, and the battery-pack side-surface protruding portions being brought into abutment against the inclination portions when the battery pack is housed in the housing portion, and
wherein, before the battery pack is positioned at a mounting position in the electronic apparatus, when the battery pack is housed in the housing portion so as to be obliquely inclined with respect to the bottom surface of the housing portion in a state where the lower surface of the battery pack and the bottom surface of the housing portion are opposed to each other and the connection terminal and the housing-portion connection terminal are opposed to each other, and when the battery-pack side-surface protruding portions of the second side surface and the third side surface are brought into abutment against the inclination portions, the battery pack slips off along the inclination portions so that the battery pack is positioned at a pre-mounting position at which the connection terminal of the battery pack and the housing-portion connection terminal are connectable to each other.

2. A battery pack housing structure according to claim 1, wherein the battery cover includes a battery-pack pushing portion at an edge portion corresponding to the fourth housing-portion side surface, and
wherein, when the battery pack is positioned at the pre-mounting position, and the battery cover is turned in a closing direction after the cover side-surface protruding portion provided at the edge portion corresponding to the fourth housing-portion side surface is fitted to a hole portion formed in the fourth housing-portion side surface, the battery-pack pushing portion pushes the battery pack toward the housing-portion connection terminal side, to thereby position the battery pack at the mounting position.

3. A battery pack housing structure according to claim 2, the battery pack comprising a battery-pack lower-surface protruding portion protruding from the lower surface of the battery pack; and
the housing portion comprising a housing-portion bottom-surface groove portion, which is formed in the bottom surface of the housing portion and capable of being fitted to the battery-pack lower-surface protruding portion,
wherein, when the battery-pack lower-surface protruding portion and the housing-portion bottom-surface groove portion are fitted to each other, a relative position of the connection terminal of the battery pack and the housing-portion connection terminal is set, and
wherein the relative position is a position in a terminal connection direction in which the connection terminal of the battery pack and the housing-portion connection terminal are connected to each other.

4. A battery pack housing structure according to claim 3, wherein when the battery-pack lower-surface protruding portion and the housing-portion bottom-surface groove portion are fitted, movement of the battery pack along the bottom surface of the housing portion and in a direction orthogonal to the connection direction of the connection terminal of the battery pack is restricted.

5. An electronic apparatus comprising the battery pack housing structure of claim 1.

* * * * *

UNITED STATES PATENT AND TRADEMARK OFFICE
CERTIFICATE OF CORRECTION

| | |
|---|---|
| PATENT NO. | : 10,476,056 B2 |
| APPLICATION NO. | : 15/777974 |
| DATED | : November 12, 2019 |
| INVENTOR(S) | : Manabu Hayahi |

It is certified that error appears in the above-identified patent and that said Letters Patent is hereby corrected as shown below:

In the Specification

Column 8, Line 58; Delete "they" and insert --the y-- therefor

Column 11, Line 34; Delete "1ld" and insert --11d-- therefor

Column 11, Line 51; Delete "llc" and insert --11c-- therefor

Signed and Sealed this
Twenty-fourth Day of November, 2020

Andrei Iancu
*Director of the United States Patent and Trademark Office*